(12) United States Patent
Danardono et al.

(10) Patent No.: US 9,679,916 B2
(45) Date of Patent: Jun. 13, 2017

(54) SEMICONDUCTOR INTEGRATED CIRCUIT

(71) Applicant: SONY CORPORATION, Tokyo (JP)

(72) Inventors: Dwi Antono Danardono, Tokyo (JP); Masahiro Sato, Tokyo (JP)

(73) Assignee: SONY CORPORATION, Tokyo (JP)

( * ) Notice: Subject to any disclaimer, the term of this patent is extended or adjusted under 35 U.S.C. 154(b) by 10 days.

(21) Appl. No.: 14/762,956

(22) PCT Filed: Nov. 21, 2013

(86) PCT No.: PCT/JP2013/081365
§ 371 (c)(1),
(2) Date: Jul. 23, 2015

(87) PCT Pub. No.: WO2014/119096
PCT Pub. Date: Aug. 7, 2014

(65) Prior Publication Data
US 2015/0372008 A1    Dec. 24, 2015

(30) Foreign Application Priority Data
Feb. 1, 2013  (JP) .................................. 2013-018032

(51) Int. Cl.
| H01L 21/66 | (2006.01) |
| H01L 27/118 | (2006.01) |
| H01L 23/00 | (2006.01) |
| H01L 23/498 | (2006.01) |

(52) U.S. Cl.
CPC ........ *H01L 27/11898* (2013.01); *H01L 22/32* (2013.01); *H01L 23/49838* (2013.01); *H01L 24/06* (2013.01); *H01L 2224/05553* (2013.01); *H01L 2224/06163* (2013.01); *H01L 2224/48091* (2013.01); *H01L 2224/49113* (2013.01); *H01L 2224/49171* (2013.01)

(58) Field of Classification Search
CPC ..... H01L 23/5286; H01L 23/50; H01L 21/82; H01L 21/822; H01L 27/04; H01L 27/11898
USPC .............................. 257/48, 203, E27.11, 688
See application file for complete search history.

(56) References Cited

U.S. PATENT DOCUMENTS

| 2004/0032019 A1* | 2/2004 | Liu .......................... H01L 23/50 257/688 |
| 2010/0327324 A1* | 12/2010 | Maede ................ H01L 23/5286 257/203 |

* cited by examiner

*Primary Examiner* — Eugene Lee
(74) *Attorney, Agent, or Firm* — Chip Law Group

(57) ABSTRACT

Provided is a semiconductor integrated circuit including: a plurality of first input/output cells arranged on a semiconductor integrated circuit substrate; a plurality of second input/output cells arranged on the semiconductor integrated circuit substrate along the plurality of first input/output cells; and a potential supply portion formed on a semiconductor package substrate, a portion of the potential supply portion protruding in a surface of the semiconductor package substrate, and configured to supply a predetermined potential to a target cell which is one of the plurality of first input/output cells and a cell neighboring the target cell among the plurality of second input/output cells through a region including the protruding portion.

5 Claims, 9 Drawing Sheets

SEMICONDUCTOR INTEGRATED CIRCUIT

TECHNICAL FIELD

The present technology relates to semiconductor integrated circuits. More particularly, the present technology relates to a semiconductor integrated circuit having an input/output cell which receives and outputs a signal and power supply.

BACKGROUND ART

There has in recent years been a demand for smaller and lighter electronic devices. Attempts have been made to increase the integration of a semiconductor integrated circuit included in an electronic device in order to, for example, reduce the size of the electronic device. A higher integration of a semiconductor integrated circuit is accompanied by an increase in the number of signals or power input to and output from the semiconductor integrated circuit. Therefore, a semiconductor package is used to efficiently distribute these signals or power.

A semiconductor chip is provided on the substrate of a semiconductor package, and a power supply ring, ground ring, lead frame, and the like are provided around the semiconductor chip. The semiconductor chip includes a plurality of input/output (I/O) cells for receiving and outputting power supply or a signal, which are arranged along an outer perimeter of the semiconductor chip. Here, the I/O cells are divided into power cells for supplying power and signal cells for receiving and outputting a signal. The power cells are connected to the power supply ring or ground ring by a wire, while the signal cells are connected to the lead frame by a wire.

As to a way to arrange I/O cells, a semiconductor integrated circuit has been proposed in which at least two rows of I/O cells are provided and a power cell is provided in a first row, where the row direction is a direction along the outer perimeter of the semiconductor chip, and the first row is a row closer to the outer perimeter (see, for example, Patent Literature 1). This is because if a power cell is provided in a second row, which is farther from the outer perimeter of the semiconductor chip, it is difficult to provide a signal cell in the same column of the first row due to mounting by wire bonding. Specifically, if a signal cell is provided in the same column of the first row, a wire connected to the power cell and a wire connected to the signal cell may cross each other. Therefore, the power cell is typically provided in the first row.

CITATION LIST

Patent Literature

Patent Literature 1: JP 2006-52036A

SUMMARY OF INVENTION

Technical Problem

However, in the above conventional technique, it may be difficult to reduce an increase in voltage drop. The value of a voltage drop is calculated by the product of a current I flowing through an interconnect and the resistance R of the interconnect, and therefore, a voltage drop is also called an IR drop. As an IR drop increases, a voltage supplied to a circuit block in a semiconductor integrated circuit is likely to be lower than or equal to an operating voltage, leading to a malfunction.

In the above semiconductor integrated circuit, a power cell is provided in the first row. Therefore, if a power supply interconnect is connected from the power cell to the circuit block in the semiconductor chip, it is necessary to arrange the power supply interconnect so that the power supply interconnect passes through a gap between I/O cells in the second row. Therefore, it is difficult to increase the width of the power supply interconnect, likely leading to an increase in IR drop.

In order to increase the width of the power supply interconnect, a power cell having the same potential as that of a power cell in the first row may be provided in the same column of the second row. However, in this configuration, the number of power cells per column increases, and therefore, a larger space is required for wire bonding in the power supply ring and ground ring. Therefore, it is necessary to increase the width of the power supply ring or ground ring. As a result, the size of the semiconductor integrated circuit is likely to increase. Therefore, it is difficult to reduce an increase in IR drop while reducing the size of a semiconductor integrated circuit.

With these circumstances in mind, the present technology has been made. It is an object of the present technology to reduce an increase in voltage drop in a semiconductor integrated circuit.

Solution to Problem

The present technology has been made in order to solve the above problem. According to a first aspect of the present technology, there is provided a semiconductor integrated circuit including: a plurality of first input/output cells arranged on a semiconductor integrated circuit substrate; a plurality of second input/output cells arranged on the semiconductor integrated circuit substrate along the plurality of first input/output cells; and a potential supply portion formed on a semiconductor package substrate, a portion of the potential supply portion protruding in a surface of the semiconductor package substrate, and configured to supply a predetermined potential to a target cell which is one of the plurality of first input/output cells and a cell neighboring the target cell among the plurality of second input/output cells through a region including the protruding portion. This provides an advantage that a predetermined potential is supplied to a target cell which is one of the plurality of first input/output cells and a cell neighboring the target cell among the plurality of second input/output cells through a region including the protruding portion.

In this first aspect, the potential supply portion may include a first supply portion formed in a band shape along the plurality of first or second input/output cells, and configured to supply a first potential, and a second supply portion formed in a band shape along the first supply portion, and configured to supply a second potential. The first supply portion may be divided at a predetermined position. A portion of the second supply portion may protrude toward the position where the first supply portion is divided. This provides an advantage that the second potential is supplied from the second supply portion, a portion of which protrudes toward the position where the first supply portion is divided.

In this first aspect, the protruding portion may be formed to protrude at a position away from a portion other than the protruding portion. This provides an advantage that a space is provided between the protruding portion of the potential supply portion and a portion other than the protruding portion of the potential supply portion.

In this first aspect, the plurality of first input/output cells may be located closer to the potential supply portion than are the plurality of second input/output cells. The potential supply portion may supply a different potential to each of two adjacent cells among the plurality of first input/output cells through a wire. This provides an advantage that different potentials are supplied to two adjacent cells among the plurality of first input/output cells through a wire.

In this first aspect, a circuit block formed on the semiconductor integrated circuit substrate; a power supply interconnect formed in a path from the first and second input/output cells to which the predetermined potential is supplied to the circuit block; a plurality of bonding pads formed in each of the first and second input/output cells to which the predetermined potential is supplied, and connected to the potential supply portion by a wire; and a test pad, against which a test probe is pressed, formed on the power supply interconnect at a position between the first and second input/output cells and the circuit block may be further included. This provides an advantage that a test pad is formed on the power supply interconnect at a position between the first and second input/output cells and the circuit block.

In this first aspect, a power supply interconnect formed in a path from the first and second input/output cells to which the predetermined potential is supplied to the circuit block may be further included. The plurality of first input/output cells and the plurality of second input/output cells may be arranged in a staggered pattern. This provides an advantage that a power supply interconnect having a greater line width is formed in a path from the first input/output cells and second input/output cells arranged in a staggered pattern to the circuit block, compared to when the input/output cells are arranged in a two-dimensional grid pattern.

Advantageous Effects of Invention

According to the present technology, a good effect that an increase in voltage drop can be reduced in a semiconductor integrated circuit can be exhibited.

DESCRIPTION OF EMBODIMENTS

Forms (hereinafter referred to as embodiments) for carrying out the present technology will now be described. Description will be provided in the following order.

1. First embodiment (an example in which a portion of a power supply ring and a portion of a ground ring are caused to protrude)
2. Second embodiment (an example in which power cells having different potentials are arranged adjacent to each other, and a portion of a power supply ring and a portion of a ground ring are caused to protrude)
3. Third embodiment (an example in which a test pad is separated from an I/O cell, and a portion of a power supply ring and a portion of a ground ring are caused to protrude)

<1. First Embodiment>

[Example Configuration of Semiconductor Integrated Circuit]

Figure 1:
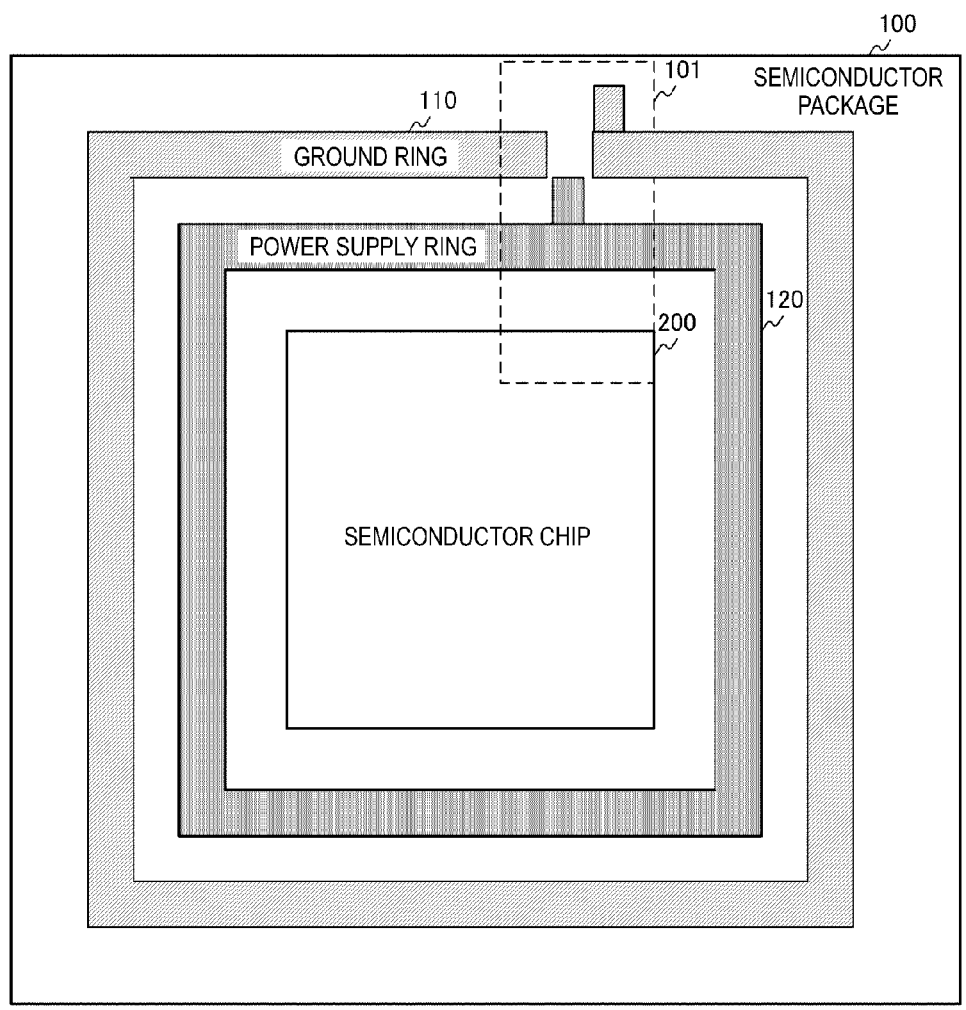
FIG. 1 is an example top view of a semiconductor integrated circuit in a first embodiment.

FIG. 1 is an example top view of a semiconductor integrated circuit in a first embodiment. The semiconductor integrated circuit includes a semiconductor package 100 and a semiconductor chip 200.

The semiconductor package 100 is a part that protects the semiconductor chip 200, and also distributes signals and power to the semiconductor chip 200. The semiconductor package 100 includes a ground ring 110 and a power supply ring 120.

The power supply ring 120 is an interconnect formed in a predetermined shape for supplying a power supply potential to the semiconductor chip 200, on a substrate of the semiconductor package 100 on which the semiconductor chip 200 is provided. For example, the power supply ring 120 is formed in the shape of a ring that surrounds the semiconductor chip 200 on the substrate of the semiconductor package 100.

The ground ring 110 is an interconnect formed in a predetermined shape for supplying a reference potential different from the power supply potential to the semiconductor chip 200, on the substrate of the semiconductor package 100 on which the semiconductor chip 200 is provided. For example, the ground ring 110 is formed in the shape of a ring that surrounds the power supply ring 120 on the substrate of the semiconductor package 100.

Note that the ground ring 110 and the power supply ring 120 are an example potential supply portion described in the appended claims. Also, in FIG. 1, the power supply ring 120 is provided outside the semiconductor chip 200, and the ground ring 110 is provided outside the power supply ring 120. Alternatively, the ground ring 110 may be provided outside the semiconductor chip 200, and the power supply ring 120 may be provided outside the ground ring 110.

The ground ring 110 is divided at a predetermined position in a rectangular region 101 that is a portion of the semiconductor integrated circuit. Also, a portion of the ground ring 110 and a portion of the power supply ring 120 protrude in a surface of a substrate of the semiconductor chip 200 (i.e., a semiconductor integrated circuit substrate). A detailed configuration of the region 101 will be described below.

The semiconductor chip 200 is an electronic part in which a large number of elements such as transistors, diodes, and the like are integrated. The semiconductor chip 200 is provided on the substrate of the semiconductor package 100.

[Example Configuration of Semiconductor Chip]

Figure 2:
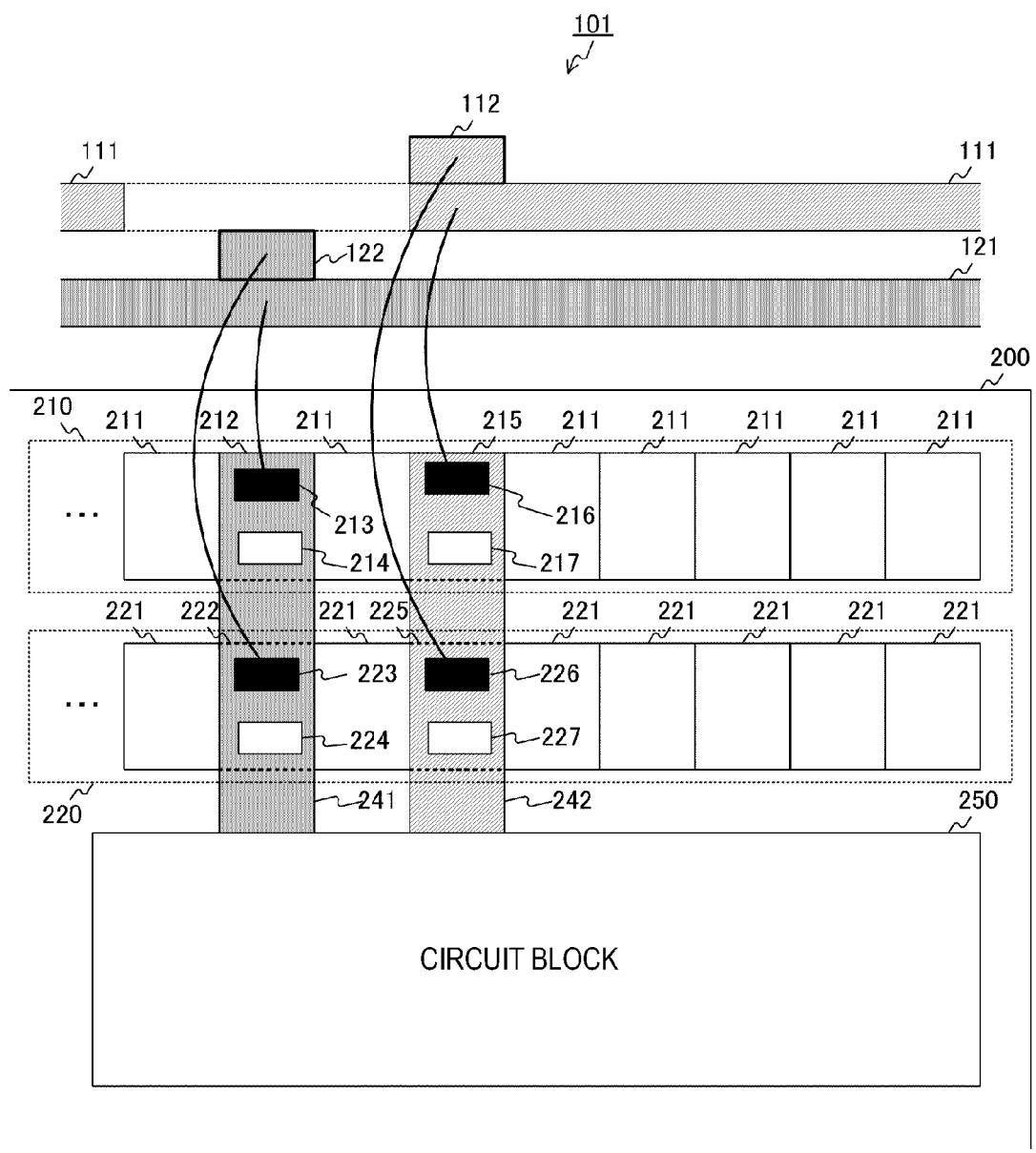
FIG. 2 is a diagram showing an example configuration of a power supply ring, a ground ring, and a semiconductor chip in the first embodiment.

FIG. 2 is a diagram showing an example configuration of the power supply ring 120, the ground ring 110, and the semiconductor chip 200 in the first embodiment, indicating details of the region 101 in FIG. 1. The region 101 includes a portion of the semiconductor chip 200. The semiconductor chip 200 includes I/O cell regions 210 and 220, power supply interconnects 241 and 242, and a circuit block 250. Also, a portion of the ground ring 110 in the region 101 is divided. Note that one portion of the divided ground ring 110 is electrically connected to the other portion through a via penetrating into a lower layer of the substrate on which the ground ring 110 is provided.

In addition, a portion of the power supply ring 120 protrudes toward the position where the ground ring 110 is divided. On the other hand, a portion of the ground ring 110 protrudes in a direction away from the power supply ring 120.

The portion of the ground ring 110 that protrudes is hereinafter referred to as the "protruding portion 112," and a portion of the ground ring 110 other than the protruding portion 112 is hereinafter referred to as the "ground ring portion 111." Also, the portion of the power supply ring 120 that protrudes is hereinafter referred to as the "protruding portion 122," and a portion of the power supply ring 120 other than the protruding portion 122 is hereinafter referred to as the "power supply ring portion 121."

The I/O cell region 210 is a region located in the vicinity of an outer perimeter of the semiconductor chip 200, where a plurality of I/O cells are arranged along the power supply ring portion 121 at a predetermined pitch. The I/O cell region 220 is a region located between the I/O cell region 210 and the circuit block 250, where a plurality of I/O cells are arranged along the I/O cell region 210 at a predetermined pitch. In other words, the semiconductor chip 200 includes two rows of I/O cells, with I/O cells in each row being arranged along the power supply ring portion 121. The I/O cell region 210 is hereinafter assumed to be the first row, and the I/O cell region 220 is hereinafter assumed to be the second row.

Also, it is assumed that a center line of an I/O cell in the first row drawn along a column direction perpendicular to the row passes through a center of one of the I/O cells in the second row. In other words, the I/O cells are arranged in a two-dimensional grid pattern.

The I/O cell region 210 includes a plurality of signal cells 211 and power cells 212 and 215 as I/O cells. The signal cells 211 are an I/O cell for receiving and outputting a signal from and to the circuit block 250. The signal cells 211 are, for example, connected to a predetermined circuit or lead frame on the semiconductor package 100 by a wire. Note that the circuit and the like connected to the signal cells 211 are not shown in FIG. 2.

The power cell 212 is an I/O cell for supplying a predetermined power supply potential to the circuit block 250. The power cell 212 is located in the first row (210) of I/O cells in the vicinity of the protruding portion 122. The power cell 212 has a bonding pad 213 and a test pad 214. The bonding pad 213 is a member for connecting to the power supply ring portion 121 by a wire. The bonding pad 213 is connected to a portion of the power supply ring portion 121 that is adjacent to the protruding portion 122. The test pad 214 is a member against which a test probe is pressed during a test.

The power cell 215 is an I/O cell for supplying a reference potential different from the power supply potential to the circuit block 250. The power cell 215 is located in the first row (210) of I/O cell in the vicinity of the protruding portion 112. The protruding portion 122 is, for example, located separately from the protruding portion 112 by one column, and therefore, the power cell 215 is located at a position separated from the power cell 212 by one column. The power cell 215 has a bonding pad 216 and a test pad 217. The bonding pad 216 is a member for connecting to the ground ring portion 111 by a wire. The test pad 217 has a configuration similar to that of the test pad 214.

The I/O cell region 220 includes a plurality of signal cells 221 and power cells 222 and 225 as I/O cells. The signal cell 221 is similar to the signal cell 211.

The power cell 222 is similar to the power cell 212. Note that the power cell 222 is located in the second row of I/O cells in the vicinity of the power cell 212 in the first row, e.g., in the same column that includes the power cell 212. Also, the power cell 222 is connected to the protruding portion 122 of the power supply ring 120 by wire bonding.

The power cell 225 is similar to the power cell 215. Note that the power cell 225 is located in the second row of I/O cells in the vicinity of the power cell 215 in the first row, e.g., in the same column that includes the power cell 215. Also, the power cell 225 is connected to the protruding portion 112 of the ground ring 110 by wire bonding.

Note that I/O cells (211, 212, and 215) in the first row are an example of one of a first and a second input/output cell described in the appended claims, and I/O cells (221, 222, and 225) in the second row are an example of the other of the first and second input/output cells.

The power supply interconnect 241 is an interconnect for supplying a power supply potential from the power cells 212 and 222 to the circuit block 250. The power supply interconnect 241 is formed in a path from the power cells 212 and 222 to the circuit block 250. In addition, the power supply interconnect 241 has a total line width similar to a width in a column direction of the power cells 212 and 222.

Here, if the power cell 212 in the first row and the power cell 222 in the second row are located in different columns, it is necessary to locate the power supply interconnect 241 from the power cell 212 in the first row so that the power supply interconnect 241 passes through a gap between I/O cells in the second row. In this case, the line width in the column direction of the power supply interconnect 241 cannot be increased, leading to a large IR drop.

In contrast to this, as shown in FIG. 2, in the configuration in which power cells (212 and 222) having the same potential are provided in the same column, it is not necessary to locate an interconnect so that the interconnect passes through a gap of the second row, and therefore, the line width of the power supply interconnect 241 can be caused to be substantially as wide as the width of an I/O cell. Therefore, the increase in IR drop can be reduced, compared to the configuration in which power cells (212 and 222) having the same potential are provided in different columns.

Also, a portion of the power supply ring 120 is caused to protrude so that the protruding portion 122 is provided. Therefore, a space for wire bonding can be ensured between the power supply ring 120 and the power cell 222 while the line width of the power supply ring 120 is maintained. If the protruding portion 122 is not provided, two power cells are provided in one column, and therefore, it is necessary to cause the power supply ring 120 to have a greater line width than when one power cell is provided in one column. However, if the line width of the power supply ring 120 is increased, the size of the semiconductor package 100 increases. Therefore, by providing the protruding portion 122, a space for wire bonding of the power supply ring 120 is ensured, whereby the increase in the size of the semiconductor package 100 is reduced. Also, similarly, by providing the protruding portion 112, a space for wire bonding of the ground ring 110 is ensured.

The power supply interconnect 242 is an interconnect for supplying a reference potential from the power cells 215 and 225 to the circuit block 250. The power supply interconnect 242 is formed in a path from the power cells 215 and 225 to the circuit block 250. In addition, the power supply interconnect 242 has a total line width similar to a width in a column direction of the power cells 215 and 225. Therefore, the increase in IR drop can be reduced, compared to the configuration in which power cells (215 and 225) having the same potential are provided in different columns.

The circuit block 250 is a circuit in which various elements such as transistors and the like are integrated.

Although two columns of power cells are provided in the semiconductor chip 200, three or more columns of power cells may be provided. Also, although two rows of I/O cells are provided in the semiconductor chip 200, three or more rows of I/O cells may be provided. Also, the power supply ring portion 121 may be divided at a predetermined position instead of the ground ring portion 111, and the protruding portion 112 may be formed, protruding toward the dividing position.

Figure 3:
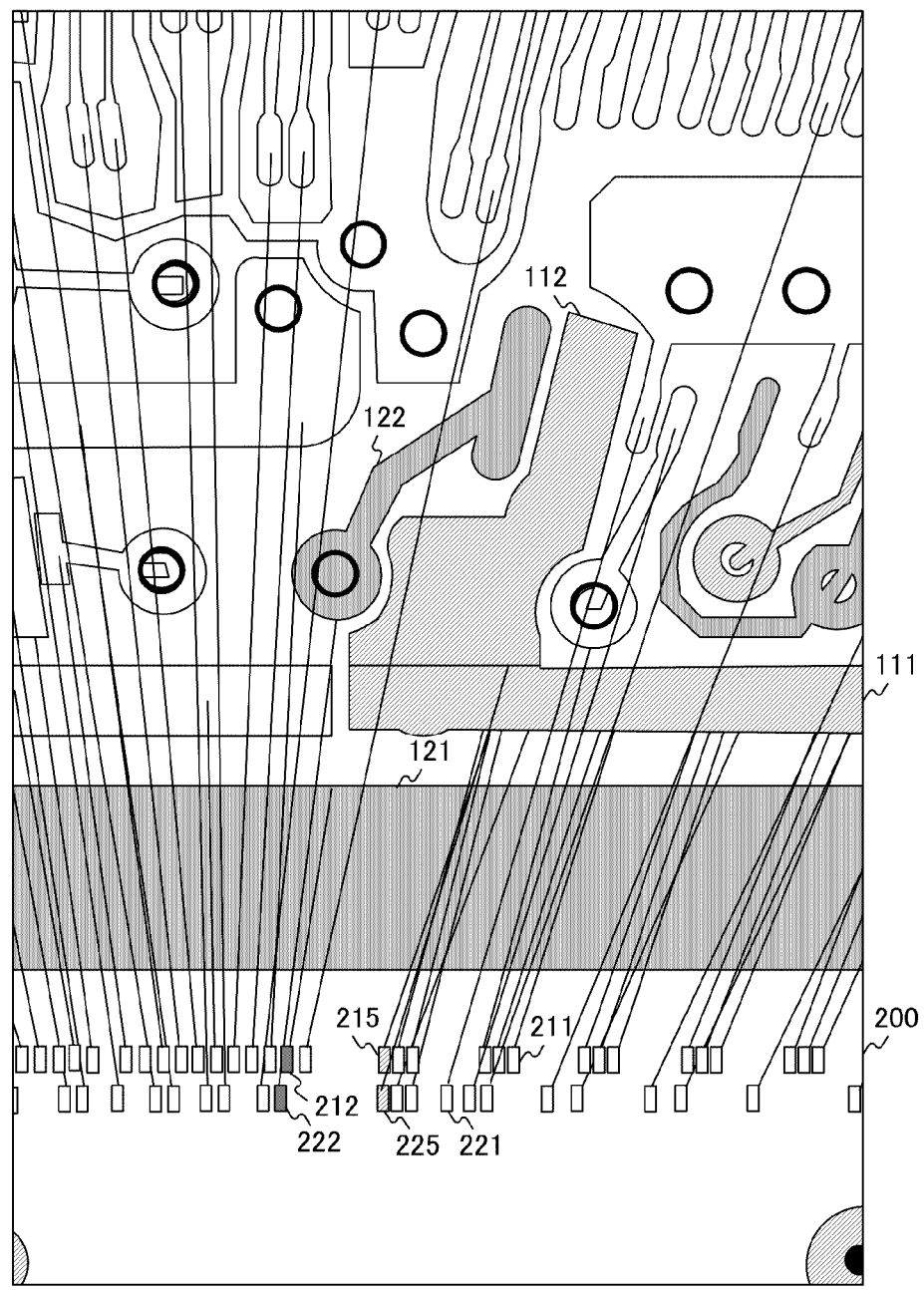
FIG. 3 is an example top view of a semiconductor package in the first embodiment.

FIG. 3 is an example top view of the semiconductor package 100 in the first embodiment. In the semiconductor package 100, the power supply ring portion 121, the ground ring portion 111, and the protruding portions 112 and 122 are provided, to which the power cell 212 and the like are connected by a wire. Also, various circuit patterns for connecting to signal cells (211, etc.) are formed around the protruding portions 112 and 122.

[First Variation]

Figure 4:
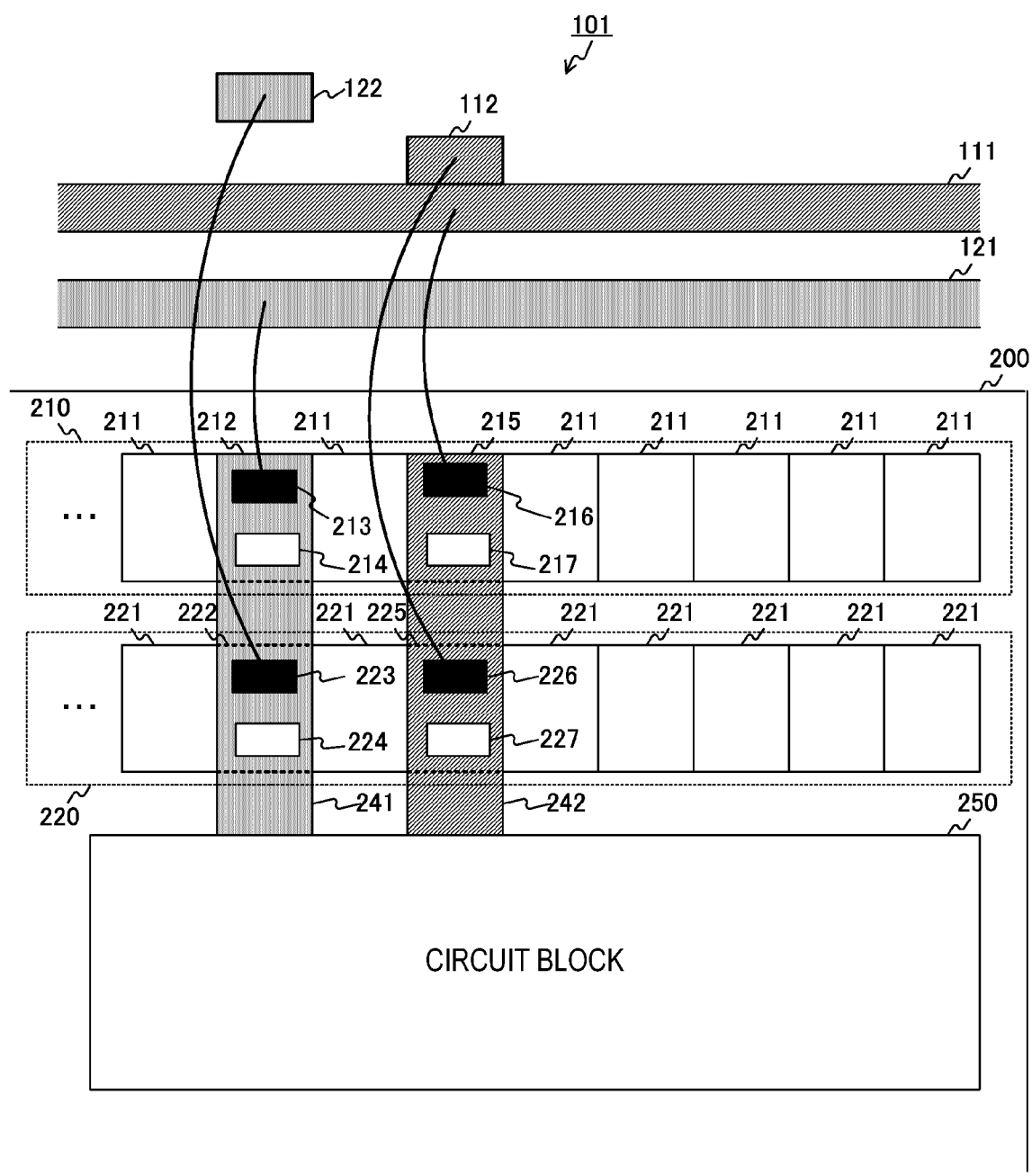
FIG. 4 is a diagram showing an example configuration of a power supply ring portion, a ground ring portion, and protruding portions in a first variation of the first embodiment.

FIG. 4 is a diagram showing an example configuration of the power supply ring portion 121, the ground ring portion 111, and the protruding portions 122 and 112 in a first variation of the first embodiment. While, in the first embodiment, the protruding portion 122 protrudes at a position adjacent to the power supply ring portion 121, the protruding portion 122 may protrude at a position away from the power supply ring portion 121. The semiconductor package 100 of the first variation is different from that of the first embodiment in that the protruding portion 122 protrudes at a position away from the power supply ring portion 121. Also, the ground ring portion 111 of the first variation is different from that of the first embodiment in that the ground ring portion 111 is not divided.

The ground ring portion 111 of the first variation is not divided. Therefore, if the protruding portion 122 is located adjacent to the power supply ring portion 121, the protruding portion 122 is likely to be in contact with the ground ring portion 111, causing a short circuit. Therefore, the protruding portion 122 is located to protrude at a position away from the ground ring portion 111 in the column direction. While the protruding portion 122 is separated from the power supply ring portion 121 on the substrate on which the semiconductor chip 200 is provided, the protruding portion 122 and the power supply ring portion 121 are electrically connected together by a conductor in a lower layer through a via penetrating through the substrate. The conductor in the lower layer that electrically connects the power supply ring portion 121 and the protruding portion 122 together may be in the shape of a ring as in the upper layer or may be in the shape of a plane.

Although the power supply ring 120 is configured so that the protruding portion 122 protrudes at a position away from the power supply ring portion 121, the ground ring 110 may be configured so that the protruding portion 112 protrudes at a position away from the ground ring portion 111.

Thus, according to the first variation, the protruding portion 122 protrudes at a position away from the power supply ring portion 121, and therefore, in the semiconductor package 100, the ground ring portion 111 can be provided while the ground ring portion 111 is not divided.

[Second Variation]

Figure 5:
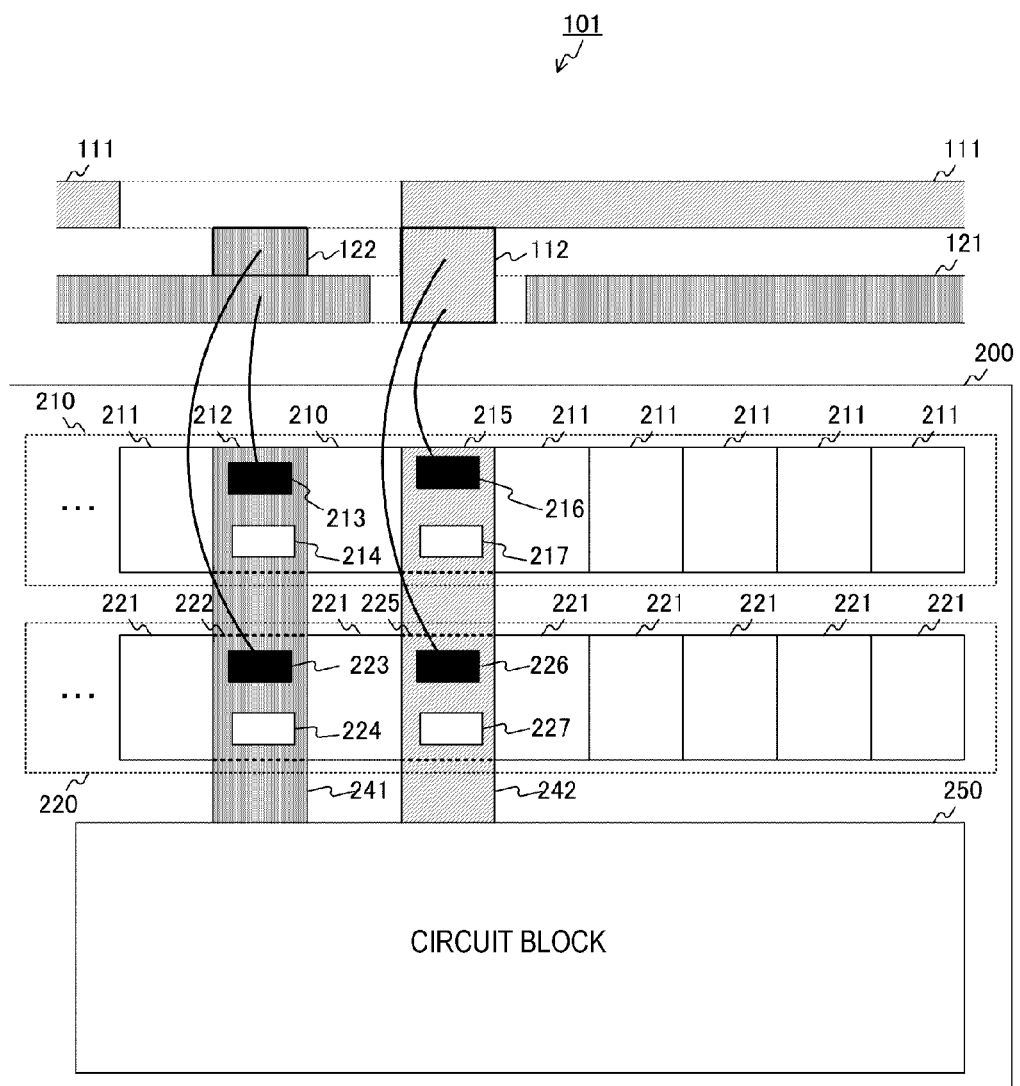
FIG. 5 is a diagram showing an example configuration of a power supply ring portion, a ground ring portion, and protruding portions in a second variation of the first embodiment.

FIG. 5 is a diagram showing an example configuration of the power supply ring 120, the ground ring 110, and the semiconductor chip 200 in a second variation of the first embodiment. While, in the first embodiment, one of the power cells (215 and 225) in the first and second rows is connected to the protruding portion 112, both of the power cells may be connected to the protruding portion 112. The semiconductor package 100 of the second variation is different from that of the first embodiment in that both of the power cells of the first and second rows are connected to the protruding portion 112. Also, the power supply ring portion 121 of the second variation is different from that of the first embodiment in that the power supply ring portion 121 is divided at a predetermined position.

The protruding portion 112 of the second variation is formed to protrude toward a position where the power supply ring portion 121 is divided. Also, the protruding portion 112 of the second variation is formed to have a larger area than that of the protruding portion 112 of the first embodiment that is connected to one power cell so that the protruding portion 112 of the second variation is connected to two power cells. The ground ring portion 111 of the second variation is connected to none of the power cells 215 and 225, and is connected to other power cells in a region other than the region 101 by a wire.

The protruding portion 112 is closer to the power cells 215 and 225 than is the ground ring portion 111. Therefore, wire bonding is more easily performed when both of these power cells are connected to the protruding portion 112.

Although the ground ring 110 is configured so that a plurality of power cells are connected to the protruding portion 112, the power supply ring 120 may be configured so that a plurality of power cells are connected to the protruding portion 122.

Thus, according to the second variation, a plurality of power cells are connected to the protruding portion 112, leading to easier wire bonding.

[Third Variation]

Figure 6:
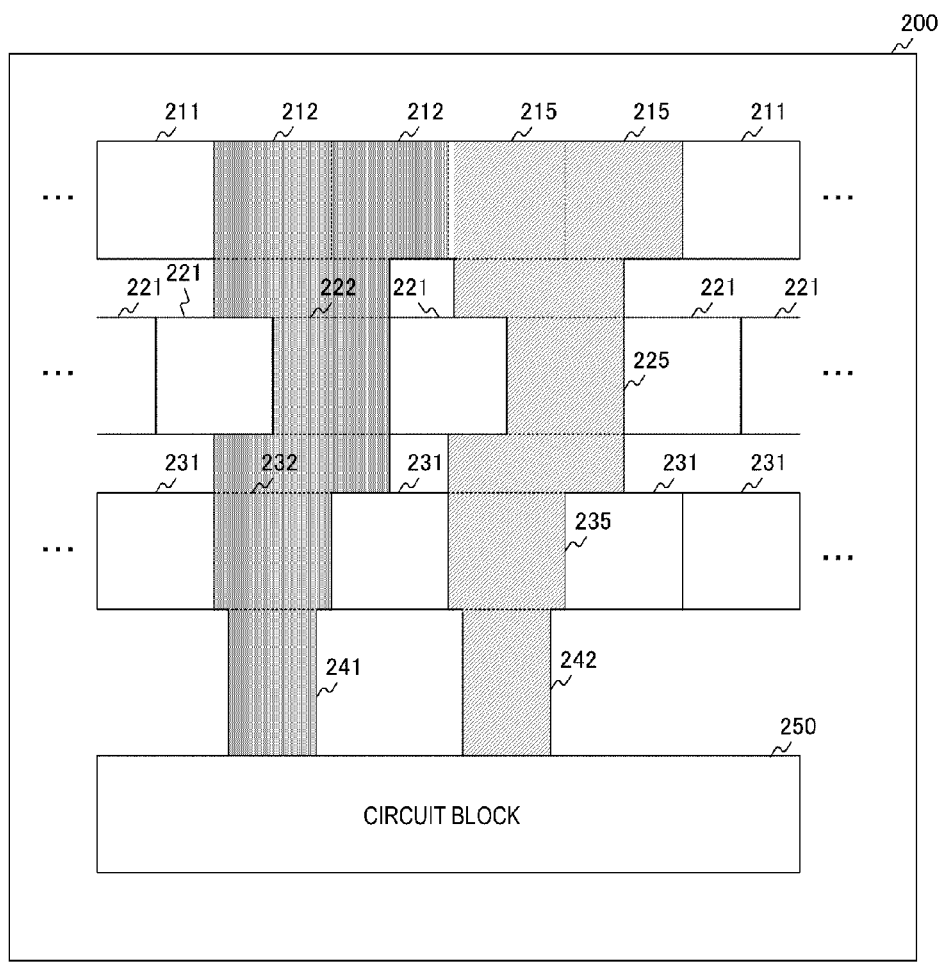
FIG. 6 is a diagram showing an example configuration of a semiconductor chip in a third variation of the first embodiment.

FIG. 6 is a diagram showing an example configuration of the semiconductor chip 200 in a third variation of the first first embodiment. While, in the first embodiment, I/O cells are arranged in a two-dimensional grid pattern, I/O cells may be arranged in a staggered pattern. The semiconductor chip 200 of the third variation is different from that of the first embodiment in that I/O cells are arranged in a staggered pattern. Also, the semiconductor chip 200 of the third variation is different from that of the first embodiment in that I/O cells are arranged in three rows instead of two rows. Here, the staggered pattern means that the center axes in the column direction of I/O cells in one row are separated from the center axes in the column direction of I/O cells in another row adjacent to that row by a predetermined distance (e.g., half the pitch).

Thus, according to the third variation, the increase in IR drop can be reduced in a semiconductor integrated circuit in which I/O cells are arranged in a staggered pattern.

<2. Second Embodiment>

[Example Configuration of Semiconductor Integrated Circuit]

Figure 7:
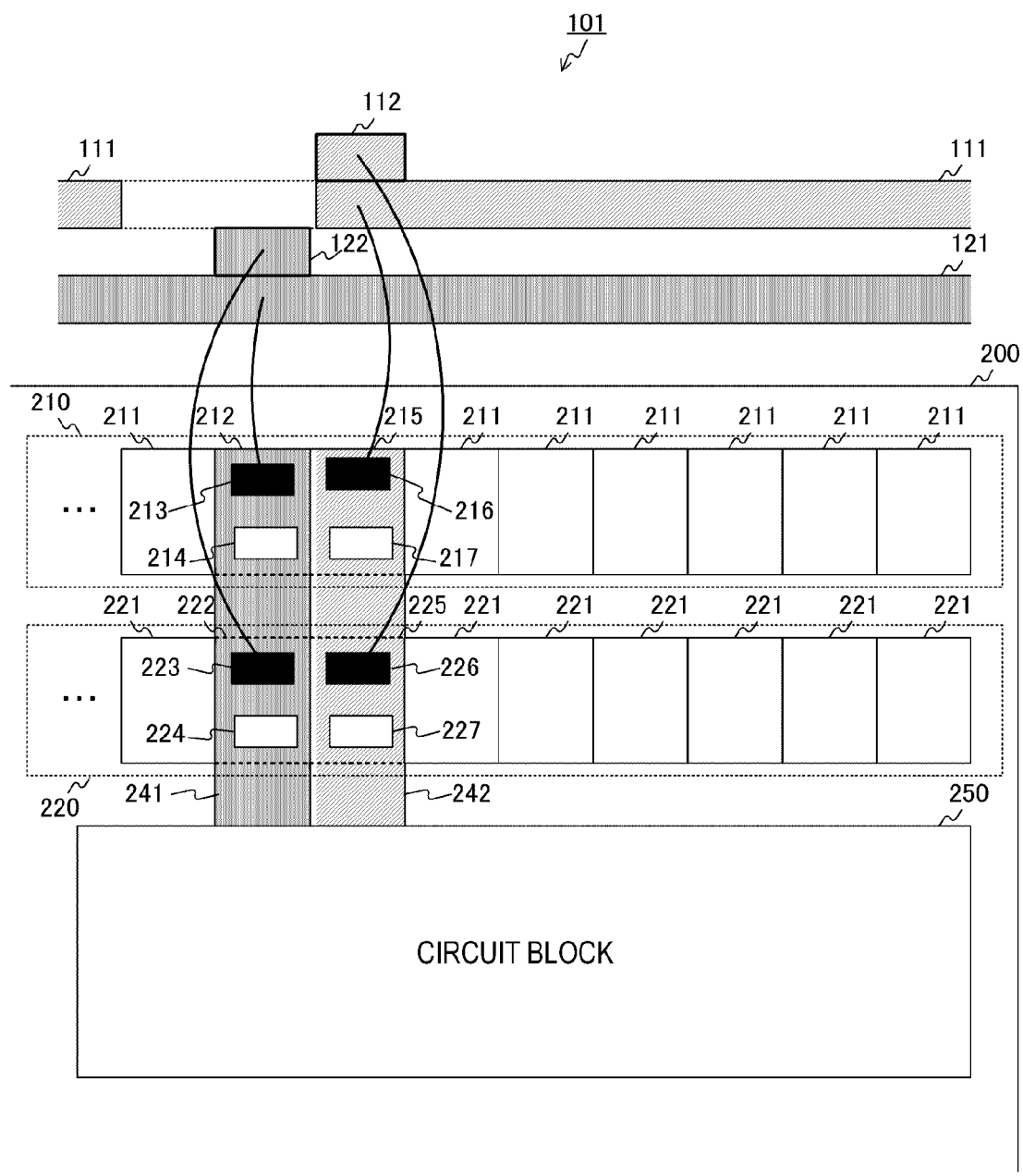
FIG. 7 is a diagram showing an example configuration of a power supply ring portion, a ground ring portion, and protruding portions in a second embodiment.

FIG. 7 is a diagram showing an example configuration of the power supply ring 120, the ground ring 110, and the semiconductor chip 200 in a second embodiment. In the first embodiment, in the first row, the power cell 212 to which a power supply potential is supplied, and the power cell 215 to which a reference potential is supplied, are located separately from each other by one column. However, it is desirable that these cells be located adjacent to each other. When these cells are located adjacent to each other, a distance between wires connected to the power cells can be reduced compared to when the cells are not located adjacent to each other. Therefore, the mutual inductance between the wires is reduced, and therefore, the IR drop is further reduced.

Thus, according to the second embodiment, power cells to which different potentials are supplied are located adjacent to each other, and therefore, the mutual inductance between wires connected to these power cells can be reduced. As a result, the IR drop is further reduced.

<3. Third Embodiment>

[Example Configuration of Semiconductor Integrated Circuit]

Figure 8:
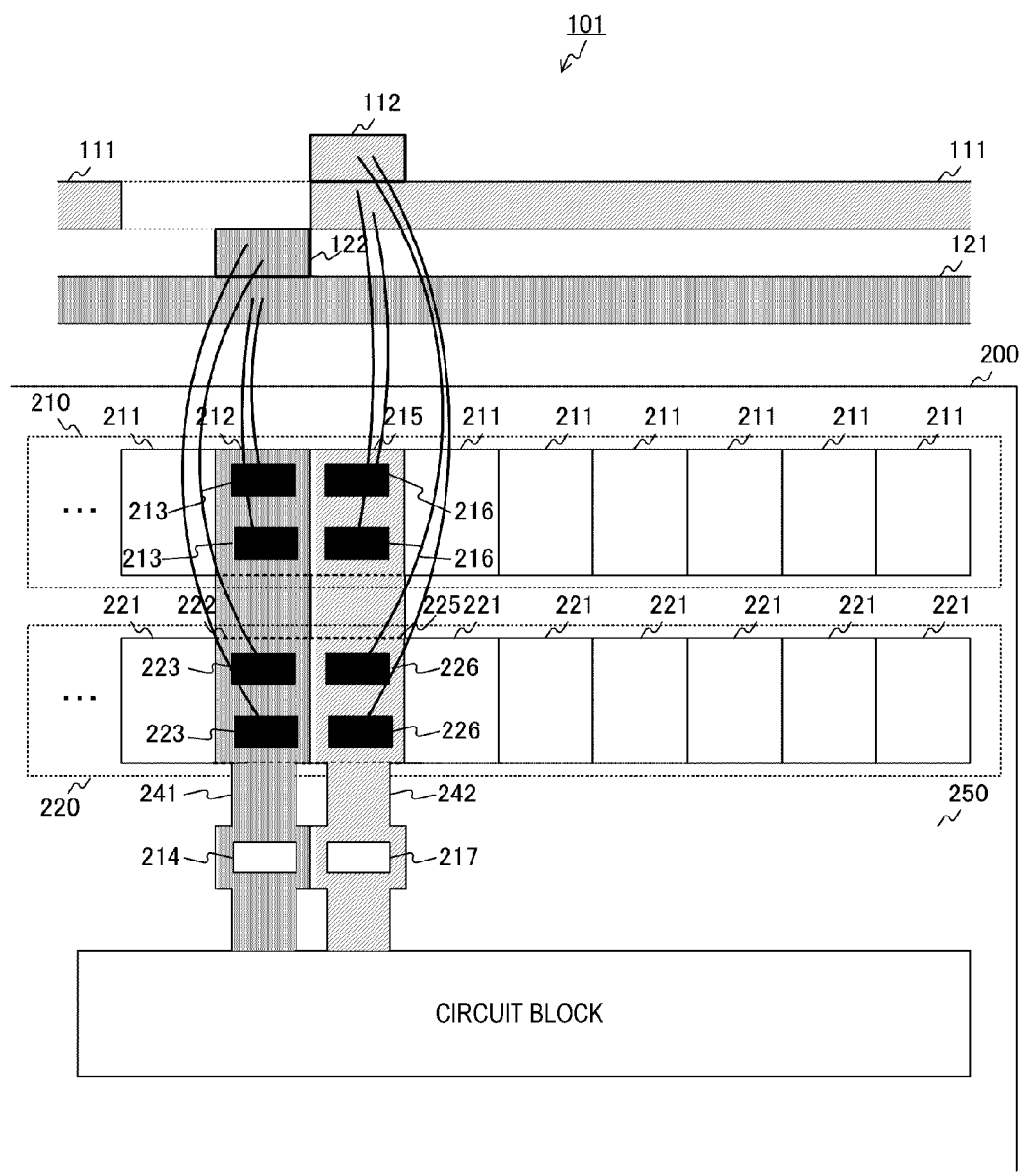
FIG. 8 is a diagram showing an example configuration of a power supply ring portion, a ground ring portion, and protruding portions in a third embodiment.

FIG. 8 is a diagram showing an example configuration of the power supply ring 120, the ground ring 110, and the semiconductor chip 200 in a third embodiment. In the second embodiment, the test pad (214, etc.) is located on the power cell (212, etc.). However, the test pad may be located at a position other than the power cell, if the test pad is located on the power supply interconnect (241 or 242). The semiconductor package 100 of the third embodiment is different from that of the second embodiment in that only one test pad (214, etc.) is provided in each column, and the test pad is located away from the power cell.

Specifically, the semiconductor package 100 does not have a test pad 224 or 227, and the test pad 214 is located on the power supply interconnect 241 at a position between the power cell 225 and the circuit block 250. Also, the test pad 217 is located on the power supply interconnect 242 at a position between the power cell 225 and the circuit block 250.

The test pad is located away from the power cell, and therefore, in each power cell, a bonding pad can be added to a space in which the test pad is provided in the first embodiment. Therefore, in each power cell (212, etc.) of the third embodiment, two bonding pads (213, etc.) are provided. Each of these bonding pads is connected to the power supply ring 120 or the ground ring 110 by a wire. A plurality of wires are connected to one I/O cell, and therefore, the combined resistance of these wires is smaller than the resistance of one wire. Therefore, the IR drop is reduced.

Thus, according to the third embodiment, the test pad is located away from an I/O cell, and therefore, a plurality of bonding pads can be provided in the I/O cell. As a result, a plurality of wires can be connected to one I/O cell, whereby the IR drop can be reduced.

[Variation]

Figure 9:
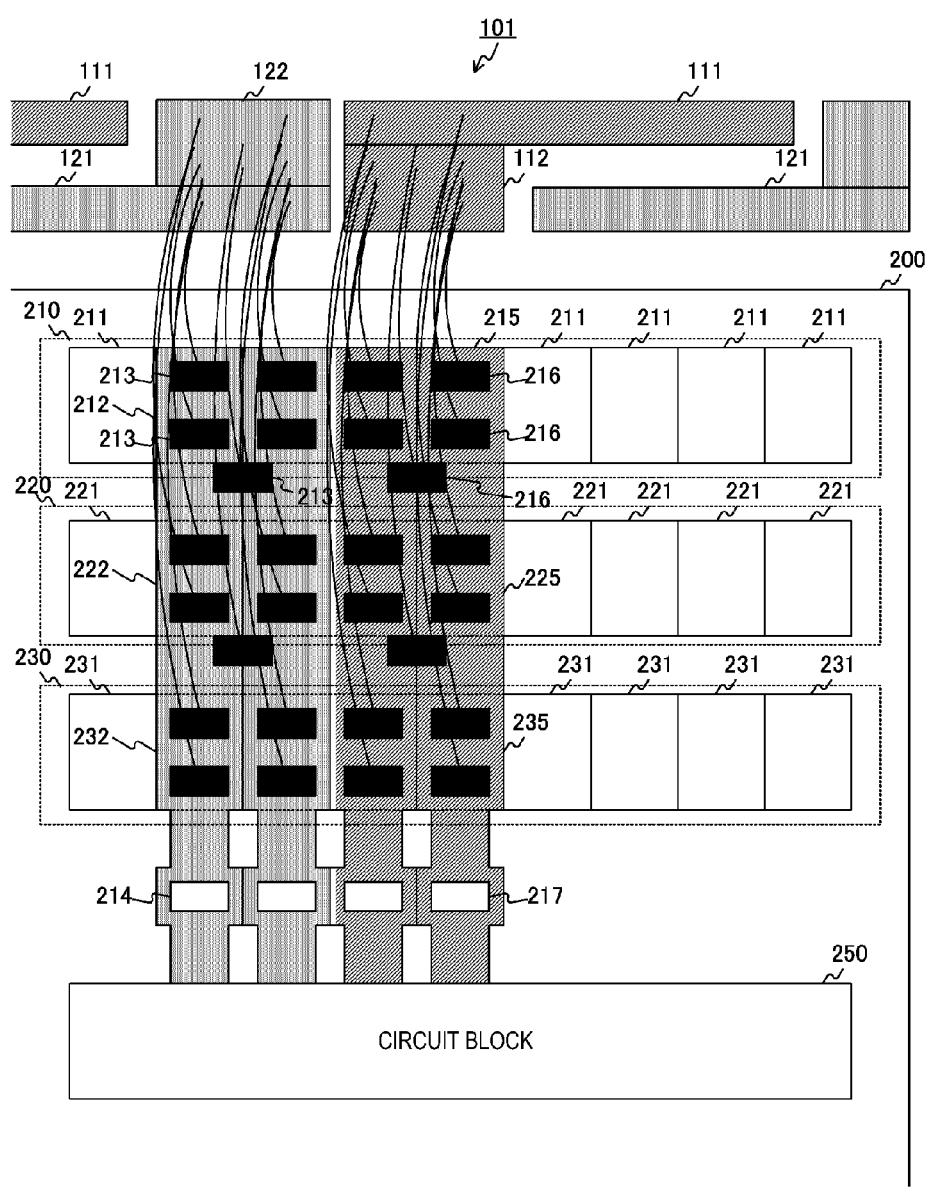
FIG. 9 is a diagram showing an example configuration of a power supply ring portion, a ground ring portion, and protruding portions in a variation of the third embodiment.

FIG. 9 is a diagram showing an example configuration of the power supply ring 120, the ground ring 110, and the semiconductor chip 200 in a variation of the third embodiment. While, in the third embodiment, a bonding pad is provided on an I/O cell, a bonding pad may be provided at a position other than I/O cells. The semiconductor chip 200 of the variation is different from that of the third embodiment in that a bonding pad is provided at a position other than I/O cells.

Specifically, in the semiconductor chip 200 of the variation, three rows of I/O cells are provided. In addition, a bonding pad is additionally provided between a power cell (212, etc.) in the first row and a power cell (222, etc.) in the second row of the same column as that of that power cell. Also, a bonding pad is additionally provided between a power cell (222, etc.) in the second row and a power cell (232, etc.) in the second row of the same column as that of that power cell.

As the number of bonding pads increases, a larger number of wires can be connected. As the number of wires increases, the combined resistance decreases. As a result, the IR drop is further reduced.

Thus, according to the variation of the third embodiment, a bonding pad is provided at a position other than I/O cells, whereby the number of wires can be increased. As a result, the IR drop is further reduced.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disk), a memory card, and a Blu-ray disc (registered trademark) can be used.

Additionally, the present technology may also be configured as below.

(1)

A semiconductor integrated circuit including:

a plurality of first input/output cells arranged on a semiconductor integrated circuit substrate;

a plurality of second input/output cells arranged on the semiconductor integrated circuit substrate along the plurality of first input/output cells; and a potential supply portion formed on a semiconductor package substrate, a portion of the potential supply portion protruding in a surface of the semiconductor package substrate, and configured to supply a predetermined potential to a target cell which is one of the plurality of first input/output cells and a cell neighboring the target cell among the plurality of second input/output cells through a region including the protruding portion.

(2)

The semiconductor integrated circuit according to (1), wherein the potential supply portion includes
a first supply portion formed in a band shape along the plurality of first or second input/output cells, and configured to supply a first potential, and a second supply portion formed in a band shape along the first supply portion, and configured to supply a second potential, wherein the first supply portion is divided at a predetermined position, and wherein a portion of the second supply portion protrudes toward the position where the first supply portion is divided.

(3) The semiconductor integrated circuit according to (1) or (2), wherein the protruding portion is formed to protrude at a position away from a portion other than the protruding portion.

(4) The semiconductor integrated circuit according to any of (1) to (3), wherein the plurality of first input/output cells are located closer to the potential supply portion than are the plurality of second input/output cells, and wherein the potential supply portion supplies a different potential to each of two adjacent cells among the plurality of first input/output cells through a wire.

(5) The semiconductor integrated circuit according to any of (1) to (4), further including:

a circuit block formed on the semiconductor integrated circuit substrate;

a power supply interconnect formed in a path from the first and second input/output cells to which the predetermined potential is supplied to the circuit block;

a plurality of bonding pads formed in each of the first and second input/output cells to which the predetermined potential is supplied, and connected to the potential supply portion by a wire; and a test pad, against which a test probe is pressed, formed on the power supply interconnect at a position between the first and second input/output cells and the circuit block.

(6) The semiconductor integrated circuit according to any of (1) to (5), further including:

a power supply interconnect formed in a path from the first and second input/output cells to which the predetermined potential is supplied to the circuit block, wherein the plurality of first input/output cells and the plurality of second input/output cells are arranged in a staggered pattern.

REFERENCE SIGNS LIST 100 semiconductor package
101 region
110 ground ring
111 ground ring portion
112, 122 protruding portion
120 power supply ring
121 power supply ring portion
200 semiconductor chip
210, 220 I/O cell region
211, 221 signal cell
212, 215, 222, 225 power cell
213, 216, 223, 226 bonding pad
214, 217, 224, 227 test pad
241, 242 power supply interconnect
250 circuit block

The invention claimed is:

1. A semiconductor integrated circuit, comprising:
   a plurality of first input/output cells arranged on a semiconductor integrated circuit substrate;
   a plurality of second input/output cells arranged on the semiconductor integrated circuit substrate along the plurality of first input/output cells; and
   a potential supply portion provided on a semiconductor package substrate, a portion of the potential supply portion that protrudes in a surface of the semiconductor package substrate, and configured to supply a determined potential to a target cell which is one of the plurality of first input/output cells and a cell that neighbors the target cell among the plurality of second input/output cells through a region that includes the portion that protrudes,
   wherein the potential supply portion includes:
      a first supply portion provided in a band shape along the plurality of first or second input/output cells, and configured to supply a first potential; and
      a second supply portion provided in a band shape along the first supply portion, and configured to supply a second potential,
      wherein the first supply portion is divided at a determined position, and
      wherein a portion of the second supply portion is configured to protrude towards the position where the first supply portion is divided.

2. The semiconductor integrated circuit according to claim 1,
   wherein the portion that protrudes is provided to protrude at a position away from a portion other than the portion that protrudes.

3. The semiconductor integrated circuit according to claim 1,
   wherein the plurality of first input/output cells are located closer to the potential supply portion than are the plurality of second input/output cells, and
   wherein the potential supply portion supplies a different potential to each of two adjacent cells among the plurality of first input/output cells through a wire.

4. The semiconductor integrated circuit according to claim 1, further comprising:
   a circuit block provided on the semiconductor integrated circuit substrate;
   a power supply interconnect provided in a path from the first and second input/output cells to which the determined potential is supplied to the circuit block;
   a plurality of bonding pads provided in each of the first and second input/output cells to which the determined potential is supplied, and connected to the potential supply portion by a wire; and
   a test pad, against which a test probe is pressed, provided on the power supply interconnect at a position between the first and second input/output cells and the circuit block.

5. The semiconductor integrated circuit according to claim 1, further comprising a power supply interconnect provided in a path from the first and second input/output cells to which the determined potential is supplied to the circuit block,
   wherein the plurality of first input/output cells and the plurality of second input/output cells are arranged in a staggered pattern.

* * * * *